(12) United States Patent
Choi

(10) Patent No.: US 6,258,693 B1
(45) Date of Patent: Jul. 10, 2001

(54) ION IMPLANTATION FOR SCALABILITY OF ISOLATION IN AN INTEGRATED CIRCUIT

(75) Inventor: Jeong Y. Choi, Palo Alto, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 08/997,106

(22) Filed: Dec. 23, 1997

(51) Int. Cl.⁷ .................................................. H01L 21/76

(52) U.S. Cl. ........................... 438/423; 438/528; 438/370

(58) Field of Search .................................... 438/423, 528, 438/370

(56) References Cited

U.S. PATENT DOCUMENTS

| | | | |
|---|---|---|---|
| 3,897,274 | * | 7/1975 | Stehlin et al. ........................ 438/423 |
| 4,098,618 | | 7/1978 | Crowder et al. ...................... 148/1.5 |
| 4,437,225 | | 3/1984 | Mizutani ............................. 29/576 B |
| 4,683,637 | | 8/1987 | Varker et al. .......................... 437/63 |
| 4,700,454 | | 10/1987 | Baerg et al. .......................... 438/440 |
| 4,748,134 | | 5/1988 | Holland et al. ........................ 437/62 |
| 4,749,660 | * | 6/1988 | Short et al. .......................... 438/423 |
| 4,800,170 | * | 1/1989 | Jain et al. ............................ 438/423 |
| 4,810,664 | | 3/1989 | Kamins et al. ........................ 437/26 |
| 4,929,566 | * | 5/1990 | Beitman ............................... 438/423 |
| 4,968,636 | | 11/1990 | Sugawara ............................. 437/24 |
| 5,017,510 | | 5/1991 | Welch et al. ......................... 437/192 |
| 5,032,535 | | 7/1991 | Kamijo et al. ........................ 437/44 |
| 5,047,356 | | 9/1991 | Li et al. ............................... 437/21 |
| 5,102,814 | | 4/1992 | Woo ...................................... 437/43 |
| 5,114,872 | | 5/1992 | Roselle et al. ........................ 437/48 |
| 5,182,226 | * | 1/1993 | Jang ..................................... 438/423 |
| 5,279,978 | | 1/1994 | See et al. ............................. 438/154 |
| 5,302,539 | | 4/1994 | Haken et al. .......................... 437/41 |
| 5,346,841 | | 9/1994 | Yajima ................................. 437/35 |
| 5,397,732 | | 3/1995 | Chen .................................... 437/69 |
| 5,418,174 | | 5/1995 | Kalnitsky ............................. 438/440 |
| 5,422,291 | | 6/1995 | Clementi et al. ...................... 437/43 |

(List continued on next page.)

OTHER PUBLICATIONS

J. Y. Chi et al., "Conversion of the conductivity mode in silicone by oxygen ion implantation and its application in a novel dielectric isolation technique," Applied Physics Letters, Mar. 1, 1982, vol. 40, No. 5, pp. 420–422.

Takayoshi Hayashi et al., "Formation of Abrupt Interfaces between Surface Silicon and Buried $SiO_2$ Layers by Very High Dose Oxygen–Ion Implantation," Japanese Journal of Applied Physics, vol. 19, (1980), No. 5, pp. 1005–1006.

P. Ratnam et al., Selectivity Implanted Oxygen Isolation Technology (SIO), Extended Abstracts, vol. 85–1, Abstract No. 231, Spring Meeting, Toronto, Ontario, Canada, May 12–17, 1985, pp. 333–334.

U. Bussmann et al., "Oxygen implantation through patterned masks: a method for forming insulated silicon device islands while maintaining a planar wafer surface," Nuclear Instruments & Methods in Physics Research, Proceedings of the Eighth International Conference on Ion Implantation Technology, Guilford, UK, Jul. 30–Aug. 3, 1990, pp. 856–859.

*Primary Examiner*—Charles Bowers
*Assistant Examiner*—David S Blum
(74) *Attorney, Agent, or Firm*—Skjerven Morrill MacPherson, LLP

(57) ABSTRACT

Implanted regions, formed in a semiconductor substrate by ion implanting oxygen or nitrogen ions, are converted to dielectric isolation regions by high temperature annealing. In some embodiments, oxygen and/or nitrogen ions are implanted at multiple predetermined depths to provide a graded implant profile in the implanted regions. In some embodiments, oxygen and/or nitrogen ions are implanted to have a peak concentration at a predetermined depth in the implanted regions. High temperature annealing is performed in an inert atmosphere or in an atmosphere having trace amounts of oxygen present for some or all of the anneal time.

8 Claims, 3 Drawing Sheets

U.S. PATENT DOCUMENTS

| | | | |
|---|---|---|---|
| 5,460,983 | 10/1995 | Hodges et al. | 437/24 |
| 5,468,657 | 11/1995 | Hsu | 437/24 |
| 5,482,872 * | 1/1996 | Wu | 438/423 |
| 5,484,738 | 1/1996 | Chu et al. | 437/33 |
| 5,488,004 | 1/1996 | Yang | 437/35 |
| 5,527,719 | 6/1996 | Park et al. | 437/25 |
| 5,589,407 | 12/1996 | Meyyappan et al. | 437/26 |
| 5,610,088 | 3/1997 | Chang et al. | 437/34 |
| 5,612,239 | 3/1997 | Lin et al. | 437/44 |
| 5,612,249 | 3/1997 | Sun et al. | 437/69 |
| 5,712,173 * | 1/1998 | Liu et al. | 438/423 |
| 5,733,813 | 3/1998 | Chen et al. | 438/440 |
| 5,807,784 * | 9/1998 | Kim | 438/423 |

* cited by examiner

ION IMPLANTATION FOR SCALABILITY OF ISOLATION IN AN INTEGRATED CIRCUIT

RELATED APPLICATION

A related application entitled "A METHOD FOR FORMING ISOLATION REGIONS SUBSEQUENT TO GATE FORMATION AND STRUCTURE THEREOF", by the inventor of the present application, is filed concurrently herewith.

BACKGROUND OF THE INVENTION

1. Field of the Invention

The invention relates generally to a method of manufacturing semiconductor devices and, more particularly, to a method for forming dielectric isolation regions on an integrated circuit semiconductor die for isolation of adjacent devices, and integrated circuits produced thereby.

2. Description of the Prior Art

In the manufacture of high density integrated circuits, individual device structures are physically separated and electrically isolated from each other by an isolation region. Increasing integrated circuit complexity and speeds require increasing the number of devices on a single die of a given size (i.e., the device density). Consequently, physical spacing between devices decreases.

Processes for forming isolation regions fall generally into two major categories. The first category encompasses all of the variations of LOCOS (Local Oxidation of Silicon) and involves exposing silicon to a heated oxidizing atmosphere to form silicon oxide. Masking the active regions to prevent oxidation permits subsequent fabrication of active device structures within those masked regions. The second category includes the various trench forming and filling isolation structures. These structures require etching a portion of the substrate and then filling the etched portion with a dielectric material.

LOCOS methods take advantage of the fact that silicon nitride can provide a thermal oxidation mask for silicon. A silicon nitride layer is patterned to expose portions of an underlying silicon substrate. When the substrate is exposed to an oxidizing atmosphere, silicon oxide is formed in the exposed portions while no oxide is formed in the unexposed portions.

Despite their broad application, LOCOS based processes have several drawbacks. First, the thermally grown oxide has approximately twice the thickness of the silicon consumed in the thermal oxidation process. Consequently, the resulting structure is non-planar.

Second, typically the silicon oxide intrudes laterally under the edge of the nitride mask. The nitride layer is pushed-up and an irregularly shaped oxide defect, called a "Bird's Beak" is formed. As the "Bird's Beak" extends into the unexposed region, the area in which devices can be built is reduced. In addition, the formation of "Bird's Beak" regions creates stress in the silicon substrate.

Finally, the various LOCOS processes suffer from oxide thinning. That is, the thickness of the oxide film grown in any specific isolation region decreases with decreasing isolation width. For example, a field oxide that is grown to a thickness of 400 nm (nanometers) above a 1.5 $\mu$m wide isolation region will be only 290 nm thick above a 0.8 $\mu$m isolation region, a reduction in thickness of more than 25%. In 0.2 $\mu$m isolation windows the thinning effect can be as large as 80%. Thus, the thickness of the isolation oxide formed can vary within a device.

These drawbacks serve to severely limit the usefulness of LOCOS-based isolation for semiconductor devices. As a result, recent efforts have focused on trench isolation and in particular shallow trench isolation (STI) for semiconductor integrated circuits employing deep sub-micron design rules. STI eliminates two major problems of LOCOS type isolation schemes. First is the intrusion into active areas by the LOCOS "Bird's Beak". Thus, absent a "Bird's Beak" region, STI allows for smaller isolation spacing than that possible with LOCOS processes. In addition, as STI involves filling a photolithographically defined trench region with a dielectric material, oxide thinning is eliminated. Thus, STI allows for isolation regions of varying widths to be fabricated within a single circuit. However, STI process and structures have other drawbacks that limit their acceptance and usefulness for devices employing sub-micron design rules. Among these other drawbacks are the increased process complexity required to create such STI regions, inversion of vertical trench sidewalls of P-type active areas, less than adequate planarity of the resulting surface, and stress induced by trench etching processes and by trench fill materials.

Therefore, improved methods of forming isolation regions are needed for semiconductor devices that will reduce and/or eliminate the effects of the problems associated with LOCOS or STI methods. In addition, these improved methods should result in a device structure with enhanced planarity. Improved methods, and structures thereof, are also needed that reduce or eliminate parasitic leakage and capacitance in such deep sub-micron semiconductor devices. Finally, the improved methods, and structures thereof, should provide reduced process complexity and manufacturing costs while resulting in increased device yields.

SUMMARY OF THE INVENTION

In accordance with the method of this invention, oxygen and/or nitrogen ion implantation is used to extend the scalability of isolation techniques. Dielectric isolation regions are formed in a semiconductor substrate by implanting oxygen and/or nitrogen ions rather than relying on thermal oxidation as in conventional LOCOS processes or the trench etch and refill methods of STI processes.

In embodiments of the present invention, a masking layer is formed and patterned to expose a region of a semiconductor substrate. The region is implanted with a first predetermined dose of oxygen ions, nitrogen ions, or a combination thereof at a predetermined energy level to create a predetermined concentration of the selected ion(s) within that implanted region. In some embodiments in accordance with the present invention, multiple implants at differing implant energies are used to distribute the implanted oxygen or nitrogen ions at different levels within the implanted region. The implanted oxygen and/or nitrogen ions diffuse rapidly throughout the dislocation region during subsequent heat treatment to permit reaction of the implanted atoms with the silicon to form silicon oxide, silicon nitride, or combinations thereof and thereby providing a dielectric isolation region.

In some embodiments, sufficient ions are implanted to permit formation of a dielectric isolation region during a subsequent annealing step in an inert atmosphere. Alternately, the annealing step can include a trace amount of oxygen during some or all of the annealing time to ensure complete conversion of the ion-implanted region, particularly the surface layer of the ion-implanted region, into a dielectric isolation region by thermal oxidation of the ion-implanted substrate surface.

In some embodiments, the implant masking layer is removed prior to heat treatment. Where the aforementioned anneal is performed in an inert atmosphere, no oxidation of substrate occurs and hence the dielectric isolation region is essentially co-planar with the surrounding semiconductor substrate surface. Where the aforementioned anneal is performed in an atmosphere having a trace amount of oxygen present as described above, a minimal thickness of silicon oxide is formed. In some embodiments this silicon oxide is subsequently removed to provide a dielectric isolation region essentially co-planar with the surrounding semiconductor surface. Advantageously, no "Birds Beak" region is formed.

BRIEF DESCRIPTION OF THE DRAWINGS

The present invention may be better understood, and its numerous objects, features, and advantages made apparent to those skilled in the art by reference to the accompanying drawings.

The use of the same reference symbols in different drawings indicates similar or identical items.

DETAILED DESCRIPTION

While the invention is described with reference Lo certain illustrated embodiments, it is understood that these embodiments are presented by way of example and not by way of limitation. The intent of the following detailed description is to cover all modifications, alternatives, and equivalents as may fall within the spirit and scope of the invention as defined by the appended claims. For example, it is understood by a person of ordinary skill practicing this invention that field isolation regions may be formed in bipolar devices and BiCMOS devices, as well as in MOS devices, to provide physical and electronic isolation between adjacent devices in an integrated circuit.

Figure 1:
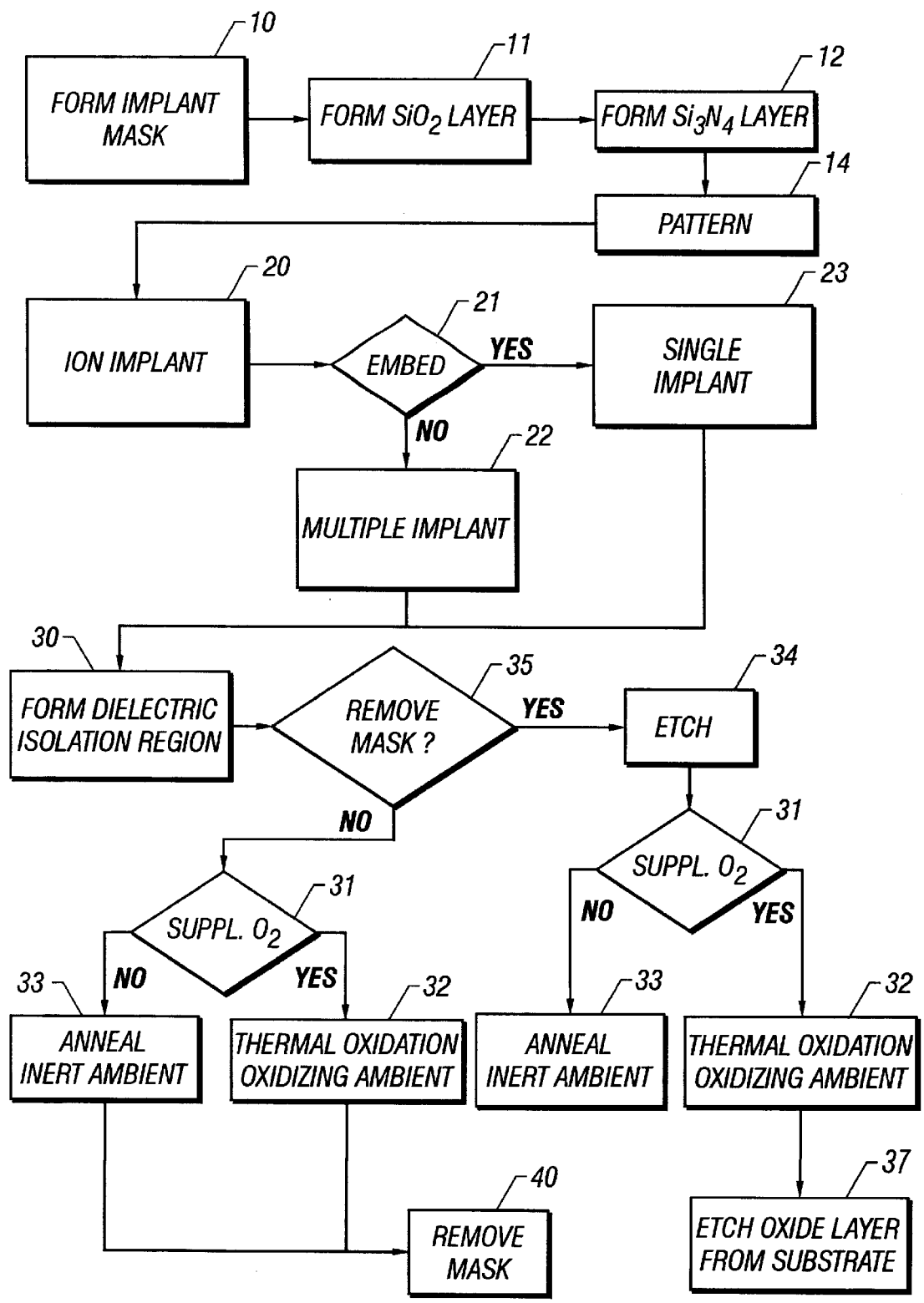
FIG. 1 is a process flow diagram in accordance with this invention.

Turning now to the drawings and in particular to FIG. 1, the process in accordance with this invention includes the steps of masking the semiconductor substrate 10, locally implanting oxygen and/or nitrogen ions into the exposed field regions 20, converting the ion-implanted region into a dielectric isolation region 30, and removing the mask 40.

The masking step 10 includes the steps of forming a silicon oxide layer at step 11, followed by deposition of an optional silicon nitride implant mask at step 12. The silicon oxide layer at step 11 is formed 10–40 nm thick on the surface of the semiconductor substrate by thermal oxidation of the silicon semiconductor at a temperature of between about 900° C. to about 1100° C., or by chemical vapor deposition (CVD). The optional silicon nitride layer is deposited onto the silicon oxide layer at step 12 also by CVD or plasma-enhanced CVD methods. It is understood by those practicing in the art that other masking materials may be used so long as those materials are capable of withstanding the elevated temperatures associated with the ion implantation step, and capable of absorbing oxygen or nitrogen ions during ion implantation to protect the underlying masked semiconductor. For example, a single layer of silicon oxide may be used as the ion implantation mask where an inert annealing process step is used to form the dielectric isolation region. Forming a dielectric isolation region using an inert-ambient heat treatment step is possible when sufficient ion implanted oxygen or nitrogen is available in the implanted region to completely form the dielectric isolation region. In this case, the silicon oxide mask may be removed using conventional techniques after ion implantation and prior to the inert atmosphere annealing step.

The masking layer is formed over the thin (approximately 10 nm to about 40 nm) capping layer. The masking layer, and optionally the silicon oxide capping layer, are patterned using conventional lithography and etching processes, to form an opening at the desired dielectric isolation region locations.

The masking layer may be selectively removed after the ion implant step, leaving the thin silicon oxide capping layer. Supplemental oxygen (less than 1%) provided in a subsequent thermal oxidation step diffuses through the capping layer to form a thin silicon oxide over the entire semiconductor surface. This layer is subsequently removed to provide dielectric isolation regions coplanar with the surface of the semiconductor die.

Figure 2A:
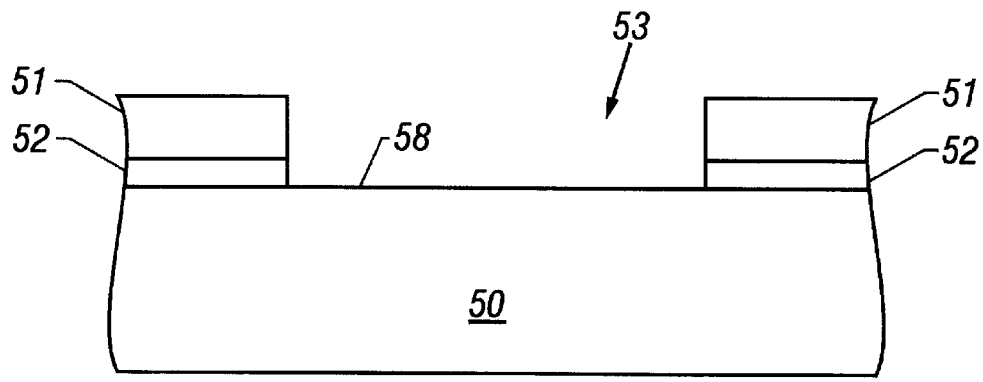
FIG. 2A is a cross-section diagram of an embodiment of the present invention depicting the semiconductor substrate having a dielectric isolation region mask deposited thereon and patterned.

FIG. 2A is a cross-sectional view of an early stage in the fabrication of embodiments of the present invention. A semiconductor substrate or wafer 50 is depicted having an implant masking layer 51 disposed thereon. The masking layer 51 is a silicon oxide, a silicon nitride, or oxynitride material typically formed by a chemical vapor deposition (CVD) or plasma enhanced CVD (PECVD) process. As shown in FIG. 2A, a silicon oxide capping layer 52 is employed underlying a silicon nitride masking layer 51. The thickness of both layers must be sufficient to block implantation of ions into active regions of the substrate. For example, a combined thickness of approximately 150–300 nm is sufficient to block ions accelerated by an implant energy of 100 KeV. Both layers have been etched to expose the semiconductor surface 58 corresponding to the desired location of the dielectric isolation region.

Alternately, the capping layer 52 may be left overlying the semiconductor substrate surface at the location of the dielectric isolation regions. The capping layer would then serve to prevent contamination of the substrate during implantation, and/or reduce the amount of both planar and axial channeling of ions that can occur during the ion implantation process. Necessarily, the thickness of the capping layer should be sufficiently thin to allow ion implantation of the semiconductor surface in the desired semiconductor surface locations, while at the same time protecting the masked regions from the aforementioned contamination and/or channeling. A capping layer thickness of between about 5–20 nm is appropriately used to provide these characteristics.

Typically, the capping layer 52 is formed of a material different than that employed for the masking layer 51. For example, where masking layer 52 is a silicon nitride material, a silicon oxide material can be used to form the capping layer. Thus by forming masking layer 51 and capping layer 52 of different materials, layer 51 can be etched selectively with respect to the capping layer to define implant mask 51 while allowing the capping layer to remain overlying region 58.

Referring again to FIG. 1, ion implantation at step 20 comprises locally implanting ions into the substrate at the dielectric isolation regions. Masked areas of the substrate are protected from penetration by the oxygen ions. A decision 21 to embed the oxygen ions in at least one layer in the semiconductor substrate in accordance with one embodiment of the method of this invention includes the step 23 of selecting at least one ion implantation energy in the range of 100 to 500 KeV, and at a dose ranging from about between $0.8 \times 10^{18}$ atoms/cm$^2$ to about $2.4 \times 10^{18}$ atoms/cm$^2$. With regard to the implant energy, where the ion implant depth is predetermined to be, for example, approximately 300 nanometers (nm), an energy exceeding 80 KeV (thousand electron volts) is appropriate, and approximately 100 KeV is typical.

In some embodiments of the present invention, multiple implants are used to create multiple layers of ion implanted regions. For example, implants at 25 KeV, 50 KeV and 100 KeV can be employed to distribute the dose of ions over a wider range of depths than is possible with a single implant. Progressively increasing the ion implantation energy in steps of approximately 50 KeV provides a distributed oxygen or nitrogen ion concentration in the dislocation region extending from the surface to any predetermined depth. The ion dose during implantation is selected to provide an approximately even ion distribution between the surface of the substrate and the bottom of the dislocation region after diffusion of the ions during a subsequent heat treatment step.

Figure 2B:
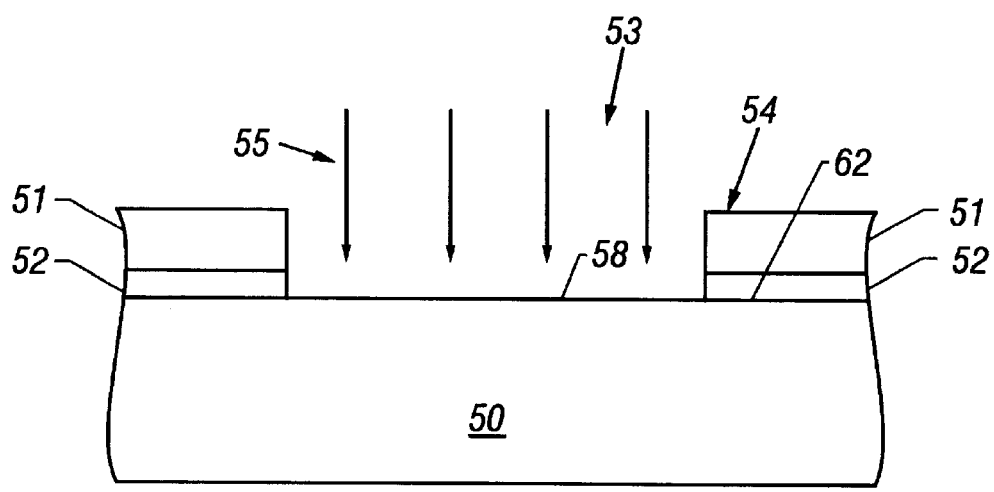
FIG. 2B is a cross section diagram of the masked semiconductor substrate of FIG. 2A depicting ion implantation into the exposed dielectric isolation region.

FIG. 2B shows the semiconductor substrate 50 with a silicon oxide capping layer 52 and a silicon nitride implant masking layer 51 patterned over the semiconductor substrate 50 to provide an opening 53 whereby oxygen ions 55 are implanted into the substrate by ion implantation. As depicted, predetermined portions of masking layer 51 and capping layer 52 are etched away to form masking portions 54 which serve to block oxygen ions 55 from being implanted into the semiconductor substrate 50 at protected areas 62. It is understood that capping layer 52 may alternately be left overlying the surface 58 for the reasons explained above.

Figure 2C:
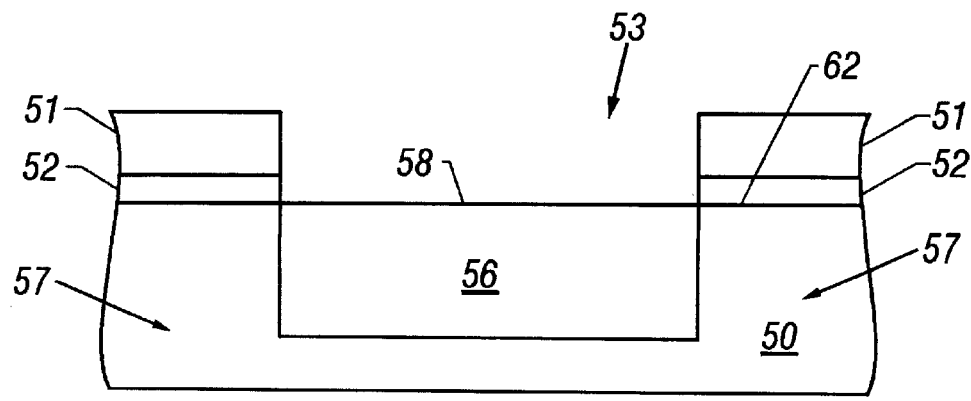
FIG. 2C is a cross section diagram of the masked semiconductor substrate of FIG. 2B depicting an ion implanted region.

FIG. 2C shows the dislocation region 56 formed in the semiconductor substrate adjacent underlying non-ion damaged semiconductor regions 57. In one embodiment, ions are implanted in a predetermined gradient beginning at the surface 58 of the substrate in the dislocation region 56 and extending into the substrate to a depth of ranging from 250 nm to about 350 nm.

Figure 2D:
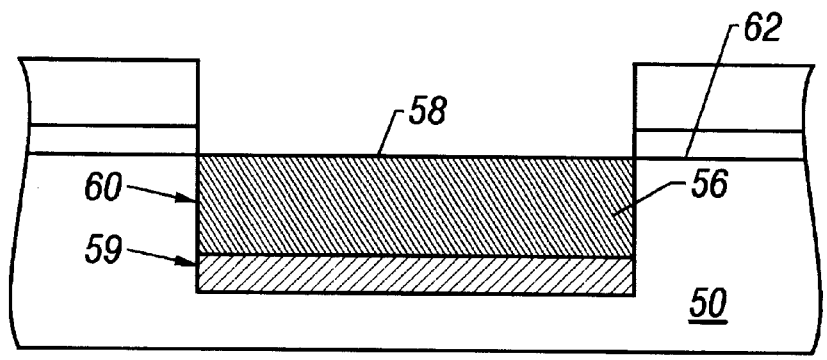
FIG. 2D is a cross section diagram of the masked semiconductor substrate of FIG. 2C showing position of the peak concentration of implanted ions within the ion implanted region.

FIG. 2D shows another embodiment wherein ions are embedded in at least one ion-embedded layer 59 of the dislocation region 56 at a predetermined depth, typically 250 nm to about 300 nm to provide an region of peak concentration of implanted ions. Where multiple implants are used to provide a stepped or graded implant, peak concentrations of ions are placed at varying positions within the implanted dislocation region 56. Since the implanted atoms diffuse more readily through the dislocation region as compared to non-ion damaged substrate, shorter anneal times are required to diffuse implanted atoms through their respective implanted regions 59, and through areas of low implanted ion concentration 60 to form the isolation region 61. In addition, as previously described, the anneal is performed in either an inert atmosphere, or in an atmosphere having only a trace amount of oxygen, therefore little oxidation of surface 58 of occurs. In this manner, surface 58 over dislocation region 56 remains essentially planar with surface 62.

Turning again to FIG. 1, the method in accordance with this invention includes the step of forming silicon oxide and/or silicon nitride in the dislocation region at step 30. In either the graded or single embedded ion layer embodiments, a decision to remove the masking layer(s) prior to heat treatment is made at step 35. Should the masking layer(s) not be removed, a decision to provide supplemental oxygen/nitrogen to the dislocation region is made at step 31. If oxygen or nitrogen ions are present in sufficient amounts to permit completely converting the ion-implanted region into a dielectric isolation region without supplemental oxygen, the thermal oxidation step is eliminated, and instead, the ion-implanted region is annealed at step 33 in an inert atmosphere at a temperature of about 900° C. to about 1300° C. for a period of about 60 to about 240 minutes. Removal of the masking layer(s) follows at 40 to provide a bare semiconductor substrate with field dielectric isolation regions essentially co-planer with the now exposed top surface of the semiconductor substrate.

In another embodiment, supplementary oxygen is provided in a thermal oxidation step 32 wherein the isolation region is heated to about 900° C. to about 1300° C. for 1–4 hours in an slightly oxidizing atmosphere. Supplemental oxygen is present in the ambient at a concentration of less than 1–2%. In those embodiments where implanted ions are so deeply embedded in the semiconductor substrate, and/or the dose of ions is insufficient to ensure complete conversion of the ion-implanted region's surface to a dielectric, the supplemental oxygen present during the thermal oxidation step 32 will ensure the conversion of the upper surface layers (10–20 nm) of the ion-implanted regions into a dielectric. Removal of the masking layer(s) follows at 40 to provide a bare semiconductor substrate with essentially co-planer field dielectric isolation regions.

In a preferred embodiment, the masking layer 34 is removed prior to heat treatment using conventional, well-known techniques. A decision 31 as to whether supplemental oxygen must be provided depends on whether sufficient oxygen or nitrogen is ion implanted in the semiconductor substrate to permit complete conversion of the ion-implanted region into a dielectric isolation region. If so, the thermal oxidation step 32 is eliminated, and the ion-implanted region is annealed at step 33 in an inert atmosphere at a temperature of about 900° C. to about 1300° C. for a period of about 60 to about 240 minutes to provide a bare substrate with essentially co-planar field dielectric isolation regions.

In an alternate embodiment, supplemental oxygen is provided at a concentration of less than 1%–2% in a thermal oxidation step 32 wherein the isolation region is heated to about 900° C. to about 1300° C. in an oxidizing atmosphere for 1 to 4 hours. The entire surface of the semiconductor substrate is oxidized to a depth of 10–30 nm. An oxide removal step 37 using conventional oxide removal techniques follows the thermal oxidation. Once the surface oxide has been removed at step 37, only the dielectric isolation regions remain, the top surfaces of which are co-planar with a now bare semiconductor substrate.

Figure 2E:
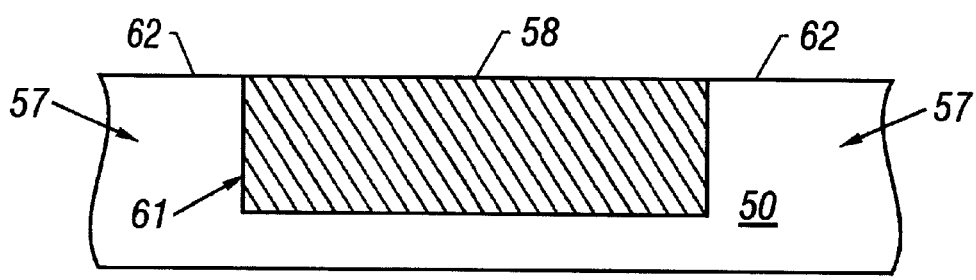
FIG. 2E is a cross section diagram of the as-annealed semiconductor substrate of FIG. 2D with the masking layers removed, and depicting the dielectric isolation region formed therein.

FIG. 2E shows the resulting dielectric isolation region 61 after the silicon oxide and silicon nitride masking layers have been removed, and any surface oxide, if present, also removed. Where the masking layer includes only a silicon oxide layer, removal is accomplished by a hydrogen fluoride etch, or by plasma etch. Where silicon nitride masking layer 51 overlies a silicon oxide capping layer 52, the silicon nitride layer 51 can advantageously be removed using a phosphoric acid etch solution, and the silicon oxide layer 52 removed using a hydrogen fluoride etch solution.

By way of explanation, and not by limitation, it is thought that the short anneal time is due to rapid diffusion of the implanted oxygen and/or nitrogen throughout the dislocation region, and the rapid conversion of the dislocation region to a dielectric region. Advantageously, dielectric isolation region thickness is decoupled from device geometry since the dielectric isolation region thickness does not now depend on the diffusion rate of oxygen from the oxidizing atmosphere through the exposed surface of a non-dislocated semiconductor. Rather, implanted oxygen or nitrogen in an amount sufficient for forming the dielectric isolation region is now intrinsic to the dislocation region.

Advantageously, the dielectric isolation region 61 formed by the method of this invention exhibits essentially no swelling or expansion, resulting in a dielectric isolation region top surface 58 layer that is essentially planar with the surface 62 of the substrate overlying the non-implanted semiconductor regions 57. Moreover, the absence of dielectric isolation region swelling drastically reduces, or essentially eliminates, "Bird's Beak" defects as compared to LOCOS methods for forming the field isolation region. Consequently, substrate stress at the masking layer/isolation region interface, and the associated device shifting resulting from that stress is also reduced or substantially eliminated as compared to LOCOS field isolation fabrication methods.

Figure 2F:
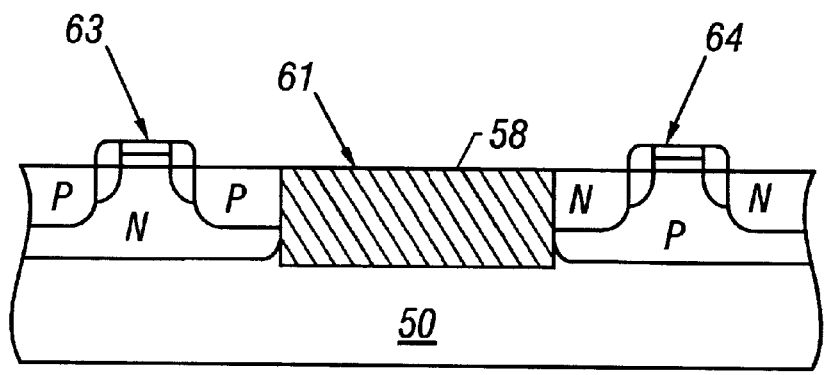
FIG. 2F is a cross section diagram of a typical CMOS transistor fabricated into the semiconductor substrate, whereby the two devices of the CMOS transistor are physically and electronically isolated from one another by the dielectric isolation region.

FIG. 2F shows the semiconductor substrate having been further processed according to conventional techniques to provide a CMOS transistor pair. The PMOS 63 and NMOS 64 transistor devices are physically and electrically isolated from one another by the field dielectric isolation region 61. In one embodiment, the isolation region extends from the semiconductor surface 58 to a depth sufficient to contact an underlying insulating substrate (not shown), thus providing effective field isolation for bipolar devices (not shown).

In view of the foregoing, it will be understood that the present invention provides a method for forming field isolation regions in an integrated circuit having a predetermined dielectric isolation region thickness independent of device geometries and isolation region width, thus providing scalabilities and device densities unattainable using conventional isolation methods such as LOCOS and its variants. It will also be evident that the implanted ions, and the dislocation region resulting from the localized ion implantation process step, permits rapid diffusion of implanted atoms throughout the dislocation region and rapid formation of the dielectric isolation region as compared to adjacent non-ion damaged semiconductor regions. The rapid localized formation of the dielectric isolation region is characterized by essentially no swelling of the dielectric isolation region, thus essentially eliminating "Bird's Beak" defects, and defects associated with swelling induced substrate stresses. It is further evident that the rapid conversion of the dislocation regions to dielectric isolation regions permits removing the implant mask and, optionally, the capping layer, prior to a thermal oxidation step in a slightly oxidizing ambient. The thin layer of silicon oxide formed during the thermal oxidation step is removed from the surface of the semiconductor substrate leaving the field dielectric isolation regions. The dielectric isolation regions are coplanar with the surface of the semiconductor substrate. Also, since the implant mask is removed prior to forming the field dielectric isolation regions, "Bird's Beak" defects are eliminated.

What is claimed is:

1. A method for making a dielectric isolation region, comprising:

forming a masking layer over a semiconductor substrate, the masking layer having a thickness sufficient to block ions accelerated by an ion implantation device;

patterning the masking layer to define a dielectric isolation area;

forming a dislocation region by implanting ions into the substrate at the dielectric isolation area; and heating in an oxidizing atmosphere the implanted substrate, wherein the heating is sufficient to cause at least a portion of the implanted ions to form a dielectric in a lower portion of the dislocation region, and the oxidizing atmosphere is sufficient to ensure the conversion into a dielectric of an upper portion of the dislocation region extending from the lower portion to a top surface of the dislocation region, the top surface of the dislocation region being essentially coplanar with a top surface of the semiconductor substrate.

2. A method as in claim 1 further comprising removing the patterned masking layer after said implanting and before said heating.

3. A method as in claim 1 wherein the implanted ions are selected from the group consisting of oxygen ions, nitrogen ions, and combinations of oxygen and nitrogen ions.

4. A method as in claim 1 wherein said implanting includes multiple ion implants to provide a plurality of ion implant layers.

5. The method of claim 1 wherein the oxidizing atmosphere comprises less than 2 percent oxygen.

6. The method of claim 1 wherein the oxidizing atmosphere comprises less than 1 percent oxygen.

7. The method of claim 1, wherein the implanting is done using an energy in the range of 100 to 500 KeV.

8. The method of claim 1, wherein the implanting is done using an energy in the range of above 150 KeV to 500 KeV.

\* \* \* \* \*